(12) United States Patent
Nishida et al.

(10) Patent No.: US 11,335,896 B2
(45) Date of Patent: May 17, 2022

(54) METHOD FOR PRODUCING YTTRIUM OXIDE-CONTAINING THIN FILM BY ATOMIC LAYER DEPOSITION

(71) Applicant: ADEKA CORPORATION, Tokyo (JP)

(72) Inventors: Akihiro Nishida, Tokyo (JP); Atsushi Yamashita, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 176 days.

(21) Appl. No.: 16/494,838

(22) PCT Filed: Feb. 13, 2018

(86) PCT No.: PCT/JP2018/004849
§ 371 (c)(1),
(2) Date: Sep. 17, 2019

(87) PCT Pub. No.: WO2018/179924
PCT Pub. Date: Oct. 4, 2018

(65) Prior Publication Data
US 2020/0083520 A1  Mar. 12, 2020

(30) Foreign Application Priority Data
Mar. 29, 2017 (JP) .............................. JP2017-064631

(51) Int. Cl.
*H01M 4/04* (2006.01)
*C23C 16/455* (2006.01)

(52) U.S. Cl.
CPC ..... *H01M 4/0428* (2013.01); *C23C 16/45553* (2013.01); *H01M 4/0442* (2013.01); *H01M 4/0471* (2013.01)

(58) Field of Classification Search
None
See application file for complete search history.

(56) References Cited

U.S. PATENT DOCUMENTS 4,882,206 A    11/1989  Erbil
2006/0275545 A1   12/2006  Yoshinaka et al.
(Continued)

FOREIGN PATENT DOCUMENTS

JP    2005/68074    3/2005
JP    2008-274374   11/2008
(Continued)

OTHER PUBLICATIONS

International Search Report dated Apr. 10, 2018 in International (PCT) Application No. PCT/JP2018/004849.
(Continued)

*Primary Examiner* — Brian R Ohara
*Assistant Examiner* — Patrick Marshall Greene
(74) *Attorney, Agent, or Firm* — Wenderoth, Lind & Ponack, L.L.P.

(57) ABSTRACT

A method for producing an yttrium oxide-containing thin film by atomic layer deposition, the method comprising: a step for introducing a raw material gas containing tris(sec-butylcyclopentadienyl) yttrium into a treatment atmosphere in order to deposit tris(sec-butylcyclopentadienyl) yttrium on a substrate; and a step for introducing a reactive gas containing water vapor into the treatment atmosphere and causing the reactive gas to react with the tris(sec-butylcyclopentadienyl) yttrium that has been deposited on the substrate, thereby oxidizing yttrium is provided.

4 Claims, 5 Drawing Sheets

(56) References Cited

U.S. PATENT DOCUMENTS

2008/0299313 A1    12/2008  Kijima
2011/0014359 A1*  1/2011  Hashim ............ H01L 21/02697
                                                                 427/80

FOREIGN PATENT DOCUMENTS

| JP | 2011-243620 | 12/2011 |
| JP | 2015-119045 | 6/2015 |
| JP | 2017-53019 | 3/2017 |

OTHER PUBLICATIONS

Extended European Search Report dated Nov. 3, 2020 in corresponding European Patent Application No. 18775277.9.

* cited by examiner

METHOD FOR PRODUCING YTTRIUM OXIDE-CONTAINING THIN FILM BY ATOMIC LAYER DEPOSITION

TECHNICAL FIELD

This invention relates to a method for producing an yttrium oxide-containing thin film by atomic layer deposition.

BACKGROUND ART

It is known that yttrium oxide thin films exhibit high heat resistance, plasma resistance and light transmission properties, and can be used in heat-resistant protective films, plasma-resistant protective films, optical thin films, and the like.

Examples of methods for producing thin films include sputtering methods, ion plating methods, coating thermal decomposition methods, MOD methods such as sol-gel methods, CVD methods and atomic layer deposition methods (hereinafter referred to as ALD methods), and CVD methods and ALD methods are mainly used due to the obtained thin films having good quality.

Patent Document 1 discloses a method for producing an yttrium oxide thin film by means of a CVD method in which tris(sec-butylcyclopentadienyl) yttrium is used as a raw material and in which nitrogen gas and oxygen gas are used.

In addition, Patent Document 2 describes that tris(sec-butylcyclopentadienyl) yttrium can be used in CVD methods and ALD methods. In addition, this document describes that in cases where tris(sec-butylcyclopentadienyl) yttrium is used in a CVD method, examples of reactive gases used according to need, include oxygen, ozone, nitrogen dioxide, nitrogen monoxide, water vapor, hydrogen peroxide, hydrogen, organic amine compounds, such as monoalkylamines, dialkylamines, trialkylamines and alkylenediamines, hydrazine and ammonia. In cases where an yttrium oxide-containing thin film is produced by means of a CVD method using tris(sec-butylcyclopentadienyl) yttrium, as in the method disclosed in this document, a reaction temperature of 250° C. to 800° C. is necessary. In particular, in cases where a high quality yttrium oxide-containing thin film, such as that disclosed in the examples, is produced by means of a CVD method, a reaction temperature of approximately 450° C. is necessary.

CITATION LIST

Patent Document

[Patent Document 1] Japanese Patent Application Publication No. 2008-274374
[Patent Document 2] Japanese Patent Application Publication No. 2005-068074

SUMMARY OF INVENTION

Technical Problem

In cases where yttrium oxide-containing thin films were produced using previously known CVD methods, large amounts of energy were required in order to vaporize raw materials serving as yttrium atom sources. In addition, since reactivity was low between raw materials serving as yttrium atom sources and reactive gases and a reaction temperature of approximately 450° C. was necessary, it was difficult to produce a high quality yttrium oxide-containing thin film at a low reaction temperature.

Solution to Problem

As a result of repeated investigations, the inventors of this invention found that this problem could be solved by a method for producing an yttrium oxide-containing thin film by using an atomic layer deposition method having specific steps, and thereby completed this invention.

This invention provides a method for producing an yttrium oxide-containing thin film by using an atomic layer deposition method which includes (A) a step for introducing a raw material gas containing tris(sec-butylcyclopentadienyl) yttrium into a treatment atmosphere to deposit tris(sec-butylcyclopentadienyl) yttrium on a substrate (hereinafter abbreviated to step (A)); and (B) a step for introducing a reactive gas containing water vapor into the treatment atmosphere and causing the reactive gas to react with the tris(sec-butylcyclopentadienyl) yttrium that has been deposited on the substrate, thereby oxidizing yttrium (hereinafter abbreviated to step (B)).

Advantageous Effects of Invention

According to this invention, it is possible to produce a smooth high quality yttrium oxide-containing thin film containing little residual carbon with good productivity at a low reaction temperature.

DESCRIPTION OF EMBODIMENTS

This method for producing an yttrium oxide-containing thin film by atomic layer deposition can be carried out using a procedure similar to that of ordinary well-known atomic layer deposition methods, but a characteristic of this invention is that a combination of step (A) and step (H) described below must be used.

Step (A) in the production method of this invention is a step for introducing a raw material gas containing tris(sec-butylcyclopentadienyl) yttrium into a treatment atmosphere in order to deposit tris(sec-butylcyclopentadienyl) yttrium on a substrate. Here, "deposit" is a concept that encompasses tris(sec-butylcyclopentadienyl) yttrium being adsorbed on a substrate. Using a raw material gas containing tris(sec-butylcyclopentadienyl) yttrium in step (A) and combining this with step (B) achieves the advantageous effect of being able to produce a high quality yttrium oxide-containing thin film at a low reaction temperature. The raw material gas containing tris(sec-butylcyclopentadienyl) yttrium used in this step preferably contains 90 vol. % or more, and more preferably 99 vol. % or more, of tris(sec-butylcyclopentadienyl) yttrium.

The method for vaporizing the tris(sec-butylcyclopentadienyl) yttrium in step (A) is not particularly limited, and it is possible to use an organometallic compound vaporization method used in ordinary well-known atomic layer deposition methods. For example, it is possible to vaporize the tris(sec-butylcyclopentadienyl) yttrium by means of heating or depressurization in a raw material container of an ALD apparatus shown in FIG. 2. The heating temperature preferably falls within the range of 20° C. to 200° C. In addition, the temperature of the substrate when the vaporized tris(sec-butylcyclopentadienyl) yttrium is deposited on the substrate in step (A) preferably falls within the range of 20° C. to 300° C., and more preferably 150° C. to 250° C.

Examples of the material of the substrate in this invention include silicon; ceramics such as indium arsenide, indium gallium arsenide, silicon oxide, silicon nitride, silicon carbide, aluminum oxide, aluminum nitride, tantalum oxide, tantalum nitride, titanium oxide, titanium nitride, titanium carbide, ruthenium oxide, zirconium oxide, hafnium oxide, tantalum oxide and gallium nitride; glasses; and metals such as platinum, ruthenium, aluminum, copper, nickel, cobalt, tungsten and molybdenum. The form of the substrate can be plate-like, spherical, fibrous or flaky. The substrate surface may be flat or a three-dimensional structure such as a trench structure.

Step (B) in the production method of this invention is a step for introducing a reactive gas containing water vapor into the treatment atmosphere and causing the reactive gas to react with the tris(sec-butylcyclopentadienyl) yttrium that has been deposited on the substrate, thereby oxidizing yttrium. Using a reactive gas containing water vapor in step (B) achieves the advantageous effect that can be reduced damage to substrates and surrounding members.

The reactive gas containing water vapor used in this step may be a gas comprising water vapor or a mixed gas of water vapor and a gas such as argon, nitrogen, oxygen or hydrogen. In the case of a mixed gas, the water vapor concentration is preferably 0.001 vol. % to 50 vol. %, more preferably 0.01 vol. % to 10 vol. %, and further preferably 0.01 vol. % to 5 vol. %.

The method for introducing the reactive gas containing water vapor into the treatment atmosphere in step (B) is not particularly limited, and the reactive gas can be introduced in the same way as in a reactive gas introduction method used in an ordinary well-known atomic layer deposition method, but it is preferable to introduce an already vaporized reactive gas into the treatment atmosphere.

The yttrium oxide-containing thin film in this invention should be a thin film containing 5 mass % or more of yttrium oxide. Examples of compounds other than yttrium oxide contained in the thin film include yttria stabilized zirconia, yttrium orthovanadate, yttrium dioxysulfide, yttrium barium copper oxide and yttrium aluminate. Of these, the production method of this invention is suitable as a method for producing a thin film consisting of yttrium oxide.

Figure 1:
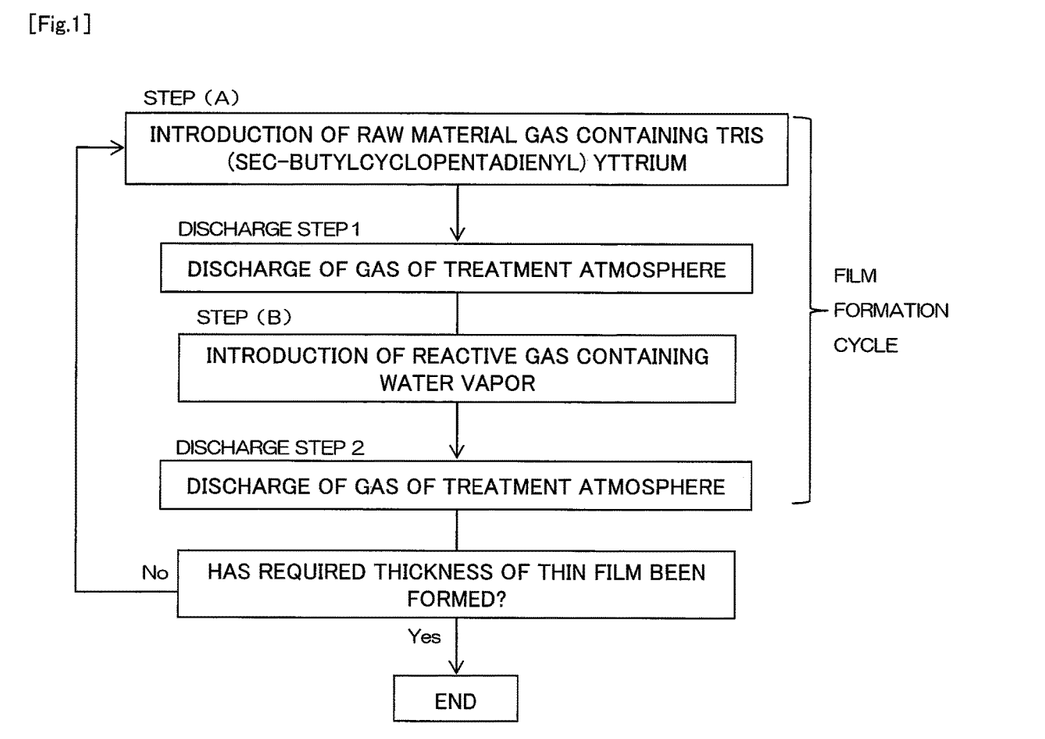
FIG. 1 is a flow chart that shows one example of the method for producing an yttrium oxide-containing thin film according to this invention.
Figure 2:
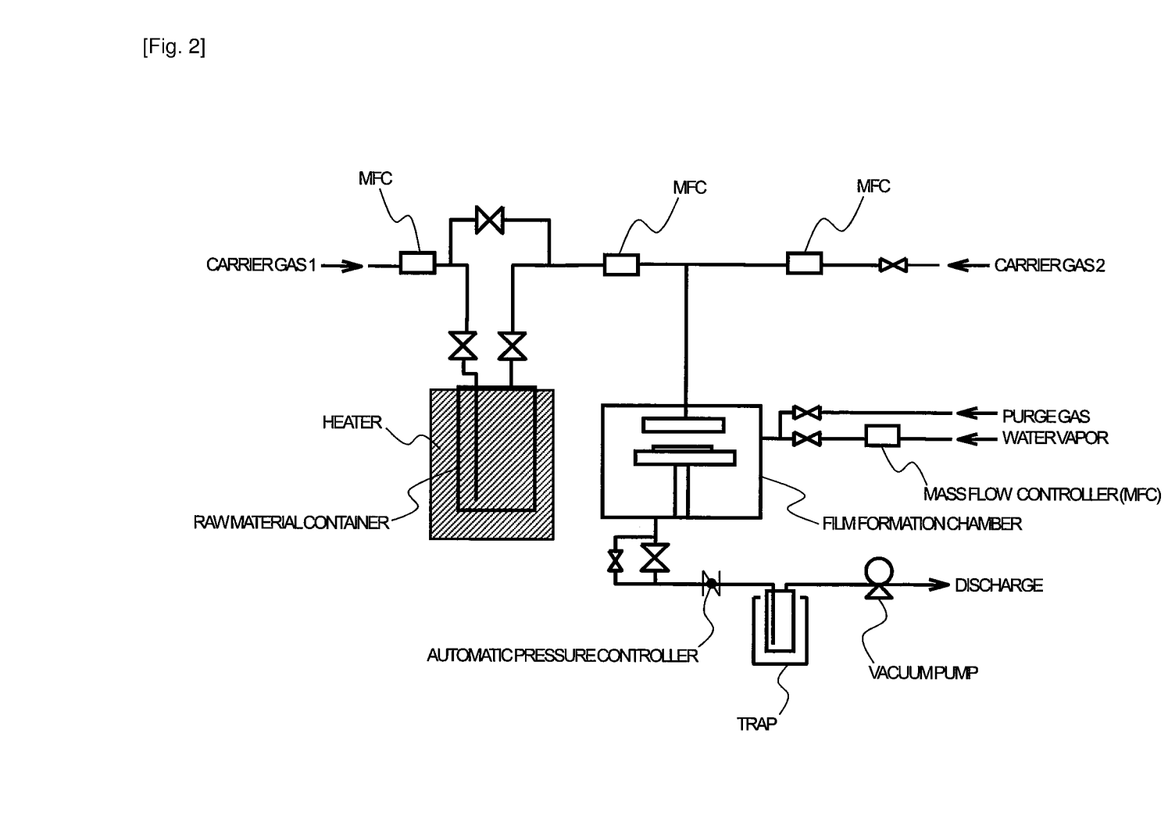
FIG. 2 is a schematic diagram that shows one example of an ALD apparatus used in the method for producing an yttrium oxide-containing thin film according to this invention.

For example, a method for producing an yttrium oxide thin film on a silicon substrate using the production method of this invention will be explained using the flow chart shown in FIG. 1. Here, the ALD apparatus shown in FIG. 2 is used.

First, the silicon substrate is disposed in a film formation chamber. The method for disposing the silicon substrate is not particularly limited, and the substrate should be disposed in the film formation chamber using an ordinary well-known method. Further, tris(sec-butylcyclopentadienyl) yttrium is vaporized in a raw material chamber, introduced into the film formation chamber, and deposited (adsorbed) on the silicon substrate, which has been heated to a temperature of 20° C. to 300° C., preferably 150° C. to 300° C., more preferably 200° C. to 300° C., and particularly preferably 200° C. to 250° C. (step (A)).

Next, tris(sec-butylcyclopentadienyl) yttrium that has not been deposited on the silicon substrate is discharged from the film formation chamber (discharge step 1). It is ideal for tris(sec-butylcyclopentadienyl) yttrium that has not been deposited on the silicon substrate to be completely discharged from the film formation chamber, but this is not necessarily essential. Examples of discharging methods include purging the system with an inert gas such as helium or argon, discharging by depressurizing the system, and combinations of these methods. In cases where depressurization is carried out, the degree of depressurization is preferably 0.01 Pa to 300 Pa, and more preferably 0.1 Pa to 100 Pa.

Next, a gas containing water vapor is introduced as a reactive gas into a film formation chamber, and the reactive gas is caused to react with the tris(sec-butylcyclopentadienyl) yttrium that has been deposited on the silicon substrate, thereby oxidizing yttrium (step (B)). Here, it is preferable for water to be vaporized in advance and introduced in the form of water vapor. When the water vapor reacts with the tris(sec-butylcyclopentadienyl) yttrium in this step, the temperature of the substrate preferably falls within the range of 20° C. to 300° C., preferably 150° C. to 300° C., more preferably 200° C. to 300° C., and particularly preferably 200° C. to 250° C. The difference between the temperature of the substrate in step (A) and the temperature of the substrate in step (B) is preferably the range of 0° C. to 20° C. in an absolute value. This is because it has been confirmed that an advantageous effect, namely the yttrium oxide-containing thin film being unlikely to warp, is achieved by adjusting within this range.

Next, unreacted water vapor and by-produced gases are discharged from the film formation chamber (discharge step 2). It is ideal for unreacted water vapor and by-produced gases to be completely discharged from inside the reaction chamber, but this is not necessarily essential. Examples of discharging methods include purging the system with an inert gas such as helium or argon, discharging by depressurizing the system, and combinations of these methods. In cases where depressurization is carried out, the degree of depressurization is preferably 0.01 Pa to 300 Pa, and more preferably 0.1 Pa to 100 Pa.

If one film formation cycle is defined as thin film deposition achieved by a series of procedures comprising step (A), discharge step 1, step (B) and discharge step 2, this cycle may be repeated a plurality of times until an yttrium oxide-containing thin film having the required film thickness is obtained.

In addition, energy such as plasma, light or a voltage may be applied in the production method of this invention. The time at which to apply this type of energy is not particularly limited, and can be, for example, when the tris(sec-butylcyclopentadienyl) yttrium gas is introduced in step (A), during the heating in step (B), when discharging from the system in the discharge steps, or between these steps.

In the production method of this invention, it is possible to carry out an annealing treatment in an inert gas atmosphere or reducing gas atmosphere in order to obtain a higher quality thin film, and in cases where step filling is required, a reflow step may be provided. The temperature in such cases is generally 400° C. to 1200° C., and preferably 500° C. to 800° C.

Figure 3:
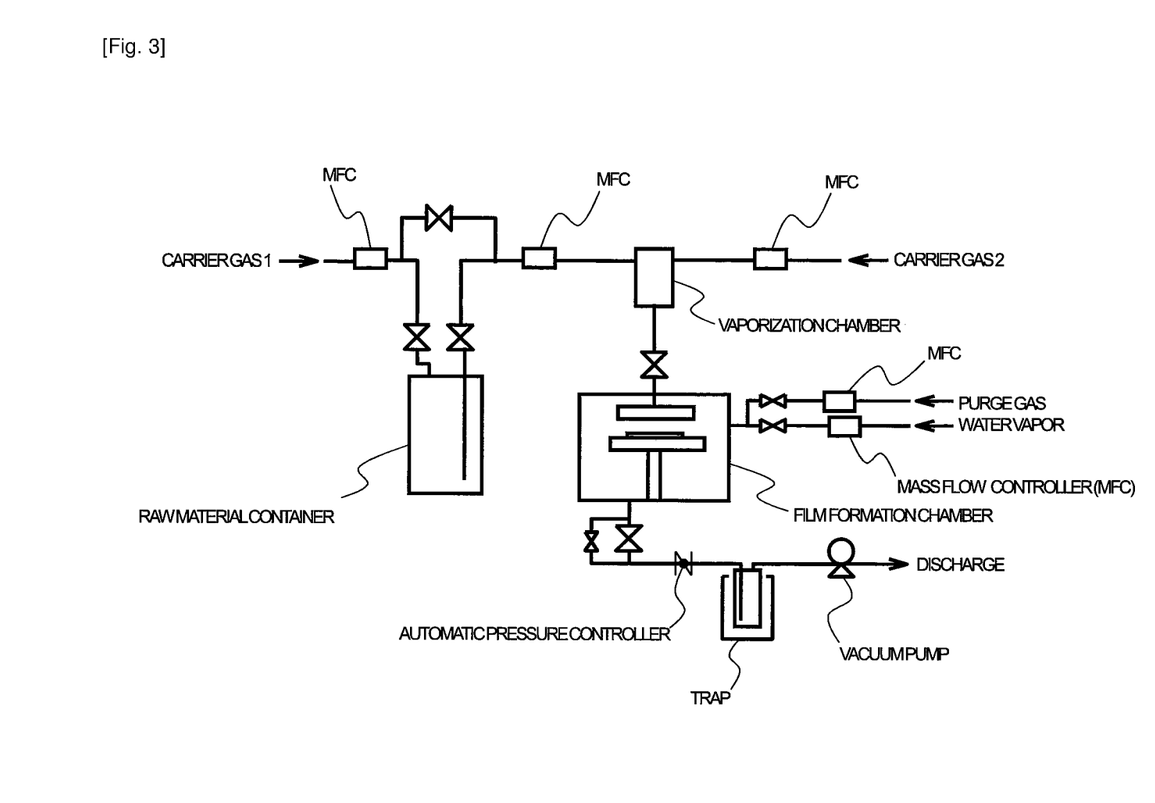
FIG. 3 is a schematic diagram that shows another example of an ALD apparatus used in the method for producing an yttrium oxide-containing thin film according to this invention.
Figure 4:
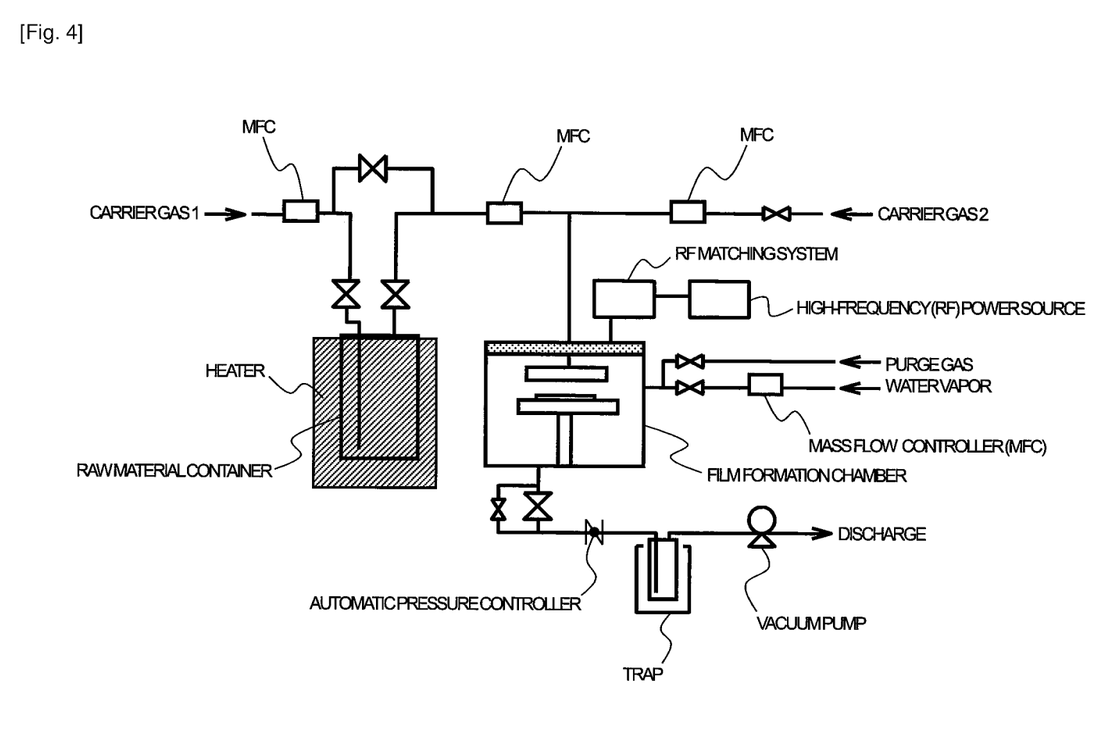
FIG. 4 is a schematic diagram that shows another example of an ALD apparatus used in the method for producing an yttrium oxide-containing thin film according to this invention.
Figure 5:
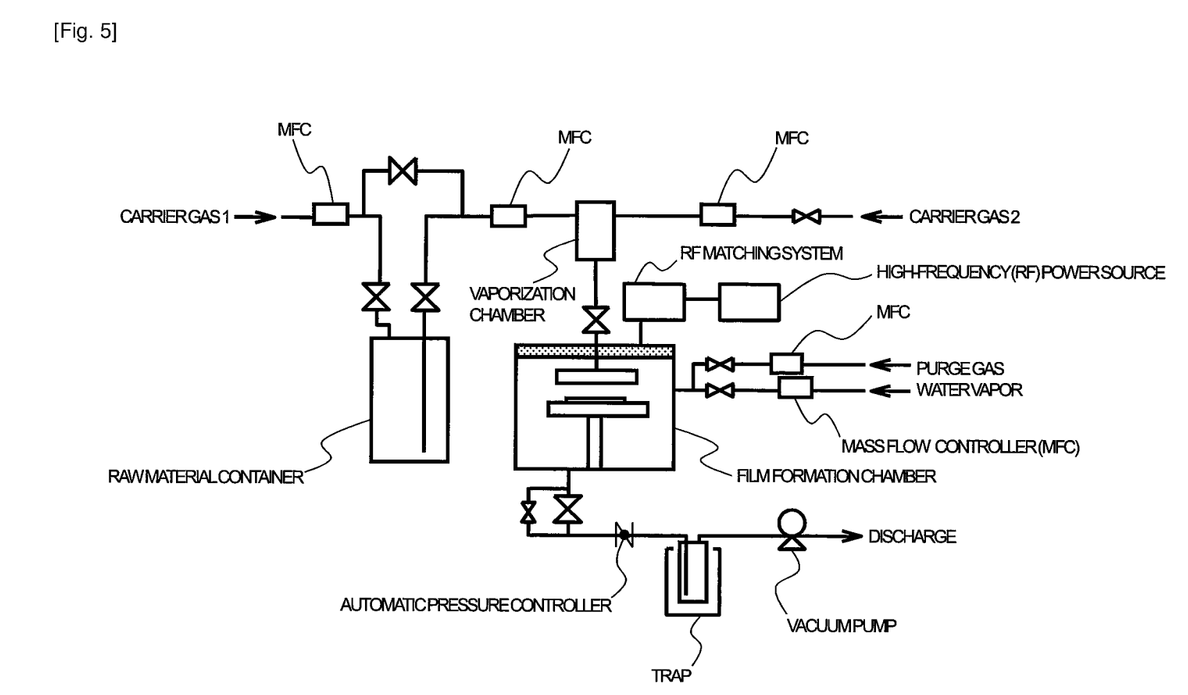
FIG. 5 is a schematic diagram that shows another example of an ALD apparatus used in the method for producing an yttrium oxide-containing thin film according to this invention.

The apparatus used for producing an yttrium oxide-containing thin film in this invention can be a well-known ALD apparatus. Specific examples of such apparatuses include an apparatus capable of supplying a raw material for atomic layer deposition by bubbling, such as that shown in FIG. 2, and an apparatus having a vaporization chamber, as shown in FIG. 3. In addition, it is possible to use an apparatus capable of subjecting a reactive gas to a plasma treatment, as shown in FIG. 4 and FIG. 5. The apparatus is not limited to single wafer type apparatuses such as those shown in FIG. 2 to FIG. 5, and may be an apparatus in which multiple wafers can be treated simultaneously by means of a batch type furnace.

EXAMPLES

This invention will now be explained in greater detail through the use of examples and comparative examples. However, this invention is in no way limited to these examples.

[Example 1] Production of Yttrium Oxide Thin Film

Using tris(sec-butylcyclopentadienyl) yttrium as a raw material for atomic layer deposition, an yttrium oxide thin film was produced on a silicon wafer by means of an ALD method under the conditions described below using the apparatus shown in FIG. 2, and this was repeated 20 times to produce 20 thin films.

The thin film composition of the produced thin films was confirmed by means of X-Ray photoelectron spectroscopy, and all of the obtained thin films were yttrium oxide, and the carbon content was lower than the detection limit of 0.1 atom %. In addition, when film thickness measurements were carried out using an X-Ray reflectance method and the average value was calculated, the average film thickness was 7.0 nm, and the average film thickness obtained in a single cycle was 0.14 nm. When cross-sectional observations were carried out using an FE-SEM (a field emission scanning electron microscope available from Hitachi High-Technologies Corporation), the thin films had smooth surfaces.

(Conditions)
Reaction temperature (silicon wafer temperature): 200° C.
Reactive gas:
Argon gas: water vapor=99.9:0.1 to 95.0:5.0 (volume ratio)

50 cycles were carried out, with one cycle being a series of steps comprising (1) to (4) below.

(1) A raw material for atomic layer deposition, which has been vaporized at a raw material container temperature of 150° C. and a raw material container pressure of 100 Pa, is introduced into a film formation chamber and deposited for 30 seconds at a system pressure of 100 Pa.

(2) Undeposited raw material is removed by purging with argon for 15 seconds.

(3) A reactive gas is introduced into the film formation chamber and allowed to react for 0.2 seconds at a system pressure of 100 Pa.

(4) Unreacted reactive gas and by-produced gases are removed by purging with argon for 60 seconds.

[Example 2] Production of Yttrium Oxide Thin Film 20 smooth thin films were produced using the same method as that used in Example 1, except that the reaction temperature (silicon wafer temperature) was changed to 250° C. The thin film composition was confirmed by means of X-Ray photoelectron spectroscopy, and all of the obtained thin films were yttrium oxide, and the carbon content was lower than the detection limit of 0.1 atom. In addition, when film thickness measurements were carried out using an X-Ray reflectance method and the average value was calculated, the average film thickness was 6.5 nm, and the average film thickness obtained in a single cycle was 0.13 nm. When cross-sectional observations were carried out using an FE-SEM, the thin films had smooth surfaces.

[Comparative Example 1] Production of Yttrium Oxide Thin Film

An attempt was made to produce 20 thin films using the same method as that used in Example 1, except that tris (cyclopentadienyl) yttrium was used as the raw material for atomic layer deposition. As a result, the 1st to 8th thin films were formed on the silicon wafer, but the thin film surfaces were highly uneven and it was not possible to form smooth thin films. In addition, the 9th to 20th thin films were not formed on the silicon wafer.

[Comparative Example 2] Production of Yttrium Oxide Thin Film

An attempt was made to produce 20 thin films using the same method as that used in Example 1, except that tris(2, 2,6,6-tetramethyl-3,5-heptanedionate) yttrium was used as the raw material for atomic layer deposition. As a result, the 1st to 8th thin films were formed on the silicon wafer, but the thin film surfaces were highly uneven and it was not possible to form smooth thin films. In addition, the 9th to 20th thin films were not formed on the silicon wafer.

In view of the results above, smooth high quality yttrium oxide thin films having little residual carbon were obtained with good productivity in Examples 1 and 2, but thin films having highly uneven surfaces were obtained in Comparative Examples 1 and 2. In addition, it was understood that the yttrium oxide thin film production methods of Comparative Examples 1 and 2 exhibited extremely poor productivity.

The invention claimed is:
1. A method for producing an yttrium oxide-containing thin film by atomic layer deposition, the method comprising:
(A) a step for introducing a raw material gas containing tris(sec-butylcyclopentadienyl) yttrium into a treatment atmosphere to deposit tris(sec-butylcyclopentadienyl) yttrium on a substrate; and
(B) a step for introducing a reactive gas containing water vapor into the treatment atmosphere and causing the reactive gas to react with the tris(sec-butylcyclopentadienyl) yttrium that has been deposited on the substrate, thereby oxidizing yttrium,
wherein a temperature of the substrate in step (B) falls within the range of 150° C. to 300° C., wherein the reactive gas containing water vapor is a mixed gas of water vapor and at least one selected from the group consisting of argon, nitrogen, oxygen and hydrogen, wherein a concentration of the water vapor in the mixed gas is 0.01 vol. % to 10 vol. %, and wherein a carbon content in the yttrium oxide-containing thin film is lower than 0.1 atom %.

2. The method for producing an yttrium oxide-containing thin film according to claim 1, wherein the method has a step for discharging the gas of the treatment atmosphere between step (A) and step (B), and/or following step (B).

3. The method for producing an yttrium oxide-containing thin film according to claim 1, wherein a film formation cycle including step (A) and step (B) is repeated in this order.

4. The method for producing an yttrium oxide-containing thin film according to claim 2, wherein a film formation cycle including step (A) and step (B) is repeated in this order.

\* \* \* \* \*